United States Patent
Corisis et al.

(10) Patent No.: US 9,673,121 B2
(45) Date of Patent: Jun. 6, 2017

(54) CARRIERLESS CHIP PACKAGE FOR INTEGRATED CIRCUIT DEVICES, AND METHODS OF MAKING SAME

(75) Inventors: David J. Corisis, Nampa, ID (US); Lee Choon Kuan, Singapore (SG); Chong Chin Hui, Singapore (SG)

(73) Assignee: Micron Technology, Inc., Boise, ID (US)

( * ) Notice: Subject to any disclaimer, the term of this patent is extended or adjusted under 35 U.S.C. 154(b) by 439 days.

(21) Appl. No.: 12/020,899

(22) Filed: Jan. 28, 2008

(65) Prior Publication Data

US 2008/0136001 A1 Jun. 12, 2008

Related U.S. Application Data

(63) Continuation of application No. 11/384,734, filed on Mar. 20, 2006, now abandoned.

(51) Int. Cl.
*H01L 21/48* (2006.01)
*H01L 23/31* (2006.01)
(Continued)

(52) U.S. Cl.
CPC ........ *H01L 23/3107* (2013.01); *H01L 21/568* (2013.01); *H01L 24/97* (2013.01); *H01L 24/45* (2013.01); *H01L 24/48* (2013.01); *H01L 24/73* (2013.01); *H01L 2224/05554* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01);
(Continued)

(58) Field of Classification Search
CPC ....................................................... H01L 21/48
See application file for complete search history.

(56) References Cited

U.S. PATENT DOCUMENTS

| 5,668,405 A | 9/1997 | Yamashita | 257/668 |
| 5,677,566 A | 10/1997 | King et al. | 257/666 |

(Continued)

FOREIGN PATENT DOCUMENTS

| EP | 0773584 | 5/1997 |
| JP | 09199637 A | 7/1997 |

(Continued)

OTHER PUBLICATIONS

Search Report and Written Opinion issued Jun. 3, 2009 in Singapore Application No. 200807000-5.

(Continued)

*Primary Examiner* — Jae Lee
(74) *Attorney, Agent, or Firm* — Perkins Coie LLP

(57) ABSTRACT

Disclosed is a carrierless chip package for integrated circuit devices, and various methods of make same. In one illustrative embodiment, the device includes an integrated circuit chip comprising an exposed backside surface defining a plane, a plurality of wire bonds that are conductively coupled to the integrated circuit chip, each of the plurality of wire bonds being conductively coupled to a conductive exposed portion, a portion of the conductive exposed portion being positioned in the plane defined by the backside surface, and an encapsulant material positioned adjacent the integrated circuit chip and the plurality of wire bonds.

25 Claims, 5 Drawing Sheets

(51) Int. Cl.
*H01L 21/56* (2006.01)
*H01L 23/00* (2006.01)

(52) U.S. Cl.
CPC ............... *H01L 2224/73265* (2013.01); *H01L 2224/85001* (2013.01); *H01L 2224/97* (2013.01); *H01L 2924/00014* (2013.01); *H01L 2924/01013* (2013.01); *H01L 2924/01027* (2013.01); *H01L 2924/01029* (2013.01); *H01L 2924/01033* (2013.01); *H01L 2924/01078* (2013.01); *H01L 2924/01079* (2013.01); *H01L 2924/14* (2013.01); *H01L 2924/1433* (2013.01); *H01L 2924/15311* (2013.01); *H01L 2924/181* (2013.01); *H01L 2924/18165* (2013.01)

(56) References Cited

U.S. PATENT DOCUMENTS

| | | | |
|---|---|---|---|
| 5,869,905 A | 2/1999 | Takebe | |
| 5,894,108 A | 4/1999 | Mostafazadeh et al. | |
| 6,072,239 A | 6/2000 | Yoneda et al. | |
| 6,133,070 A | 10/2000 | Yagi et al. | |
| 6,258,632 B1* | 7/2001 | Takebe | 438/127 |
| 6,373,140 B1 | 4/2002 | Onodera et al. | |
| 6,395,580 B1* | 5/2002 | Tseng | 438/108 |
| 6,518,647 B1* | 2/2003 | Tellkamp | 257/646 |
| 6,700,190 B2* | 3/2004 | Siegel et al. | 257/684 |
| 6,738,263 B2 | 5/2004 | Corisis et al. | 361/784 |
| 6,867,500 B2 | 3/2005 | Corisis et al. | 257/777 |
| 6,900,528 B2 | 5/2005 | Mess et al. | 257/686 |
| 6,924,550 B2 | 8/2005 | Corisis et al. | 257/686 |
| 6,939,739 B2 | 9/2005 | Corisis | 438/108 |
| 6,949,821 B2 | 9/2005 | Corisis | 257/701 |
| 6,979,596 B2 | 12/2005 | Corisis et al. | 438/118 |
| 6,987,325 B2 | 1/2006 | Corisis et al. | 257/786 |
| 2002/0014686 A1* | 2/2002 | Kanemoto et al. | 257/678 |
| 2003/0008483 A1* | 1/2003 | Sato et al. | 438/514 |
| 2003/0045084 A1 | 3/2003 | Kazama et al. | |
| 2003/0062631 A1 | 4/2003 | Nemoto | |
| 2003/0132533 A1 | 7/2003 | Kawahara et al. | |
| 2004/0017000 A1 | 1/2004 | Chiu et al. | |
| 2004/0018659 A1 | 1/2004 | Hosokawa et al. | |
| 2005/0023660 A1* | 2/2005 | Saga | 257/678 |
| 2005/0035357 A1 | 2/2005 | Fjelstad | |
| 2005/0176171 A1 | 8/2005 | Miyaki et al. | |
| 2005/0214980 A1 | 9/2005 | Shiu et al. | |
| 2005/0218300 A1* | 10/2005 | Quinones et al. | 250/214 R |
| 2005/0253240 A1 | 11/2005 | Nuechter et al. | |
| 2007/0194424 A1 | 8/2007 | Camacho et al. | |
| 2007/0216033 A1 | 9/2007 | Corisis et al. | |
| 2007/0249100 A1 | 10/2007 | Corisis et al. | |

FOREIGN PATENT DOCUMENTS

| | | |
|---|---|---|
| JP | 2001-230270 | 8/2001 |
| JP | 2003078071 A | 3/2003 |
| JP | 2003142509 A | 5/2003 |
| JP | 2003303919 A | 10/2003 |
| JP | 2004063615 | 2/2004 |

OTHER PUBLICATIONS

Examination Report issued Dec. 21, 2009 in European Patent Application No. 07758569.3.
Written Opinion issued Mar. 5, 2010 in Singapore Application No. 200807000-5.
Notice of Rejection issued Sep. 18, 2012 in Japan Application No. 2009-501655, 5 pages.
Notice of Rejection issued Jun. 21, 2011 in Japan Application No. 2009-501655, 7 pages.
Office Action issued Sep. 27, 2010 in Republic of Korea Application No. 10-2008-7025143, 9 pages.
International Search Report and Written Opinion for PCT/US2007/064028, mailed Jan. 14, 2008.

* cited by examiner

CARRIERLESS CHIP PACKAGE FOR INTEGRATED CIRCUIT DEVICES, AND METHODS OF MAKING SAME

CROSS-REFERENCE TO RELATED APPLICATION

This application is a continuation of U.S. application No. 11/384,734 filed Mar. 20, 2006, now abandoned which is incorporated herein by reference in its entirety.

BACKGROUND OF THE INVENTION

1. Field of the Invention

The present invention generally relates to the field of packaging integrated circuit devices, and, more particularly, to a carrierless chip package for integrated circuit devices, and various methods of make same.

2. Description of the Related Art

Microelectronic devices generally have a die (i.e., a chip) that includes integrated circuitry having a high density of very small components. In a typical process, a large number of die are manufactured on a single wafer using many different processes that may be repeated at various stages (e.g., implanting, doping, photolithography, chemical vapor deposition, plasma vapor deposition, plating, planarizing, etching, etc.). The die typically include an array of very small bond pads electrically coupled to the integrated circuitry. The bond pads are the external electrical contacts on the die through which the supply voltage, signals, etc. are transmitted to and from the integrated circuitry. The die are then separated from one another (i.e., singulated) by back-grinding and cutting the wafer. After the wafer has been singulated, the individual die are typically "packaged" to couple the bond pads to a larger array of electrical terminals that can be more easily coupled to the various power supply lines, signal lines and ground lines.

Electronic products require packaged microelectronic devices to have an extremely high density of components in a very limited space. For example, the space available for memory devices, processors, displays and other microelectronic components is quite limited in cell phones, PDAs, portable computers and many other products. As such, there is a strong drive to reduce the height of a packaged microelectronic device and the surface area or "footprint" of a microelectronic device on a printed circuit board. Reducing the size of a microelectronic device is difficult because high performance microelectronic devices generally have more bond pads, which result in larger ball/grid arrays and thus larger footprints.

FIGS. 1A-1B are, respectively, a cross-sectional and top view of an illustrative packaged integrated circuit (IC) device 10. The packaged IC device 10 is comprised of an integrated circuit chip 12 that is affixed to a carrier 14 by an adhesive material 18. The chip 12 and carrier 14 comprise a plurality of bond pads 20 and 22, respectively. A plurality of wire bonds 24 conductively couple the bond pads 20 on the chip 12 with the bond pads 22 on the carrier 14. Also depicted in FIG. 1A is a conductive structure 28, such as a printed circuit board, a motherboard, a memory module, or the like. The conductive structure 28 typically comprises a plurality of insulated traces (not shown) and a plurality of bond pads 30. In one illustrative embodiment, the chip 12 is conductively coupled to the conductive structure 28 by a plurality of solder balls 30. The chip 12 is encapsulated with a molding or epoxy compound 16.

FIG. 1B is a top view of the device 10 with the epoxy compound 16 removed. As shown therein, the bond pads 22 on the carrier 14 occupy a lot of space. The presence of the bond pads 22 can, in some cases, cause the carrier 14 to delaminate. Such delamination can cause the chip 12 to fail or at least not perform up to its full capabilities. Moreover, the packaged IC device 10 can be relatively large due to its basic configuration, the components involved, and the manner in which it is fabricated. For example, the distance 11 between the edge of the chip 12 and the edge of the epoxy compound 16 may range from approximately 0.5-1.0 mm. The carrier 14 may have a thickness that varies from approximately 125-450 µm, depending on the application and the composition of the carrier 14. Similarly, the thickness of the epoxy compound 16 may also vary, e.g., from approximately 0.5-1.2 mm. Thus, the overall height 13 of the carrier 14 and epoxy compound 16 may range from approximately 0.40-1.65 mm.

The present invention is directed to a device and various methods that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a carrierless chip package for integrated circuit devices, and various methods of make same. In one illustrative embodiment, the device comprises an integrated circuit chip comprising an exposed backside surface defining a plane, a plurality of wire bonds that are conductively coupled to the integrated circuit chip, each of the plurality of wire bonds being conductively coupled to a conductive exposed portion, a portion of the conductive exposed portion being positioned in the plane defined by the backside surface, and an encapsulant material positioned adjacent the integrated circuit chip and the plurality of wire bonds.

In another illustrative embodiment, the device comprises an integrated circuit chip comprising an exposed backside surface defining a plane, a plurality of wire bonds that are conductively coupled to the integrated circuit chip, each of the plurality of wire bonds being conductively coupled to a conductive exposed portion, a portion of the conductive exposed portion being positioned in the plane defined by the backside surface, and an encapsulant material positioned adjacent the integrated circuit chip and the plurality of wire bonds, the encapsulant material comprising a bottom surface that is positioned substantially in the plane, wherein a distance from a side of the integrated circuit chip to a side of the encapsulant material ranges from approximately 0.1-0.4 mm.

In yet another illustrative embodiment, the device comprises an integrated circuit chip comprising an exposed backside surface defining a plane and a plurality of wire bonds that are conductively coupled to the integrated circuit chip, each of the plurality of wire bonds being conductively coupled to a conductive exposed portion, a portion of the conductive exposed portion being positioned in the plane defined by the backside surface, wherein the exposed conductive portions lying in the plane have a substantially rounded configuration. The device further comprises an encapsulant material positioned adjacent the integrated circuit chip and the plurality of wire bonds and a conductive structure that is conductively coupled to the exposed conductive portions.

In one illustrative embodiment, the method comprises positioning an integrated circuit chip adjacent a sacrificial structure comprising a conductive portion, the integrated circuit chip comprising a backside surface, attaching a plurality of wire bonds to the integrated circuit chip, attaching the plurality of wire bonds to the conductive portion of the sacrificial structure to thereby define a conductive portion coupled to each of the wire bonds, forming an encapsulant material adjacent the integrated circuit chip, the wire bonds and the sacrificial structure, and removing the sacrificial structure to thereby expose the backside surface of the integrated circuit chip and at least a portion of the conductive portion that is conductively coupled to each of the plurality of wire bonds.

In another illustrative embodiment, the method comprises positioning an integrated circuit chip adjacent a sacrificial structure comprising a conductive layer, the integrated circuit chip comprising a backside surface, attaching a plurality of wire bonds to the integrated circuit chip and to the conductive layer of the sacrificial structure to thereby define a conductive portion coupled to each of the wire bonds, forming an encapsulant material adjacent the integrated circuit chip, the wire bonds and the conductive layer of the sacrificial structure, and performing a planarization process to remove the sacrificial structure to thereby expose the backside surface of the integrated circuit chip and at least a portion of the conductive portion conductively coupled to each of the plurality of wire bonds.

In yet another illustrative embodiment, the method comprises positioning an integrated circuit chip adjacent a sacrificial structure comprising a plurality of spaced-apart conductive structures, the integrated circuit chip comprising a backside surface, attaching each of a plurality of wire bonds to the integrated circuit chip and to one of the spaced-apart conductive structures of the sacrificial structure to thereby define a conductive portion coupled to each of the wire bonds, forming an encapsulant material adjacent the integrated circuit chip, the wire bonds and the sacrificial structure, and performing a planarization process to remove the sacrificial structure to thereby expose the backside surface of the integrated circuit chip and at least a portion of the conductive portion conductively coupled to each of the plurality of wire bonds.

BRIEF DESCRIPTION OF THE DRAWINGS

The invention may be understood by reference to the following description taken in conjunction with the accompanying drawings, in which like reference numerals identify like elements, and in which.

Figure 1A:
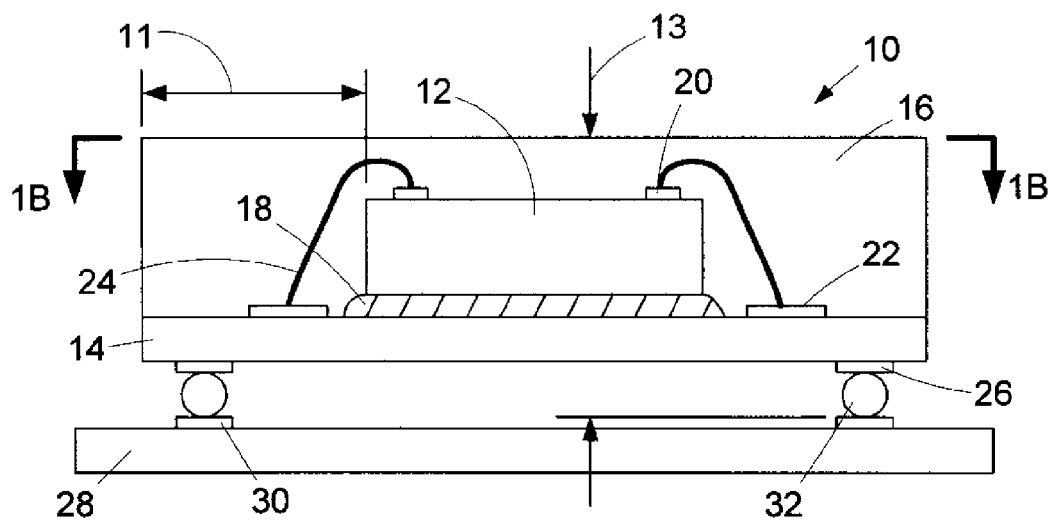
FIGS. 1A-1B depict an illustrative prior art packaged integrated circuit device.
Figure 1B:
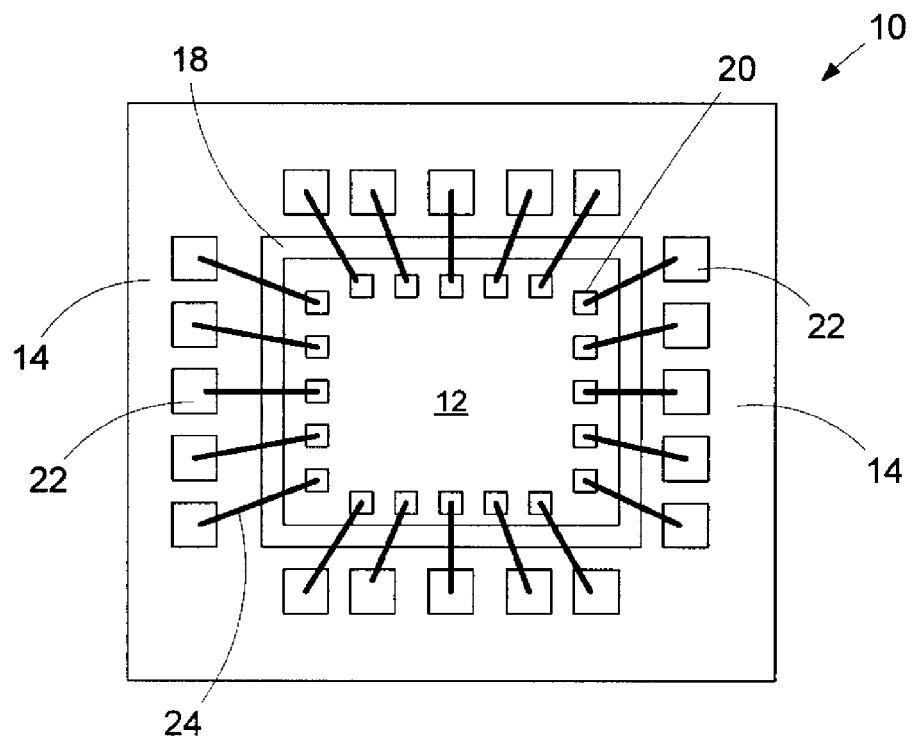

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various regions and structures of a packaged integrated circuit device are depicted in the drawings. For purposes of clarity and explanation, the relative sizes of the various features depicted in the drawings may be exaggerated or reduced as compared to the size of those features or structures on real-world packaged devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be explicitly set forth in the specification in a definitional manner that directly and unequivocally provides the special definition for the term or phrase.

Figure 2A:
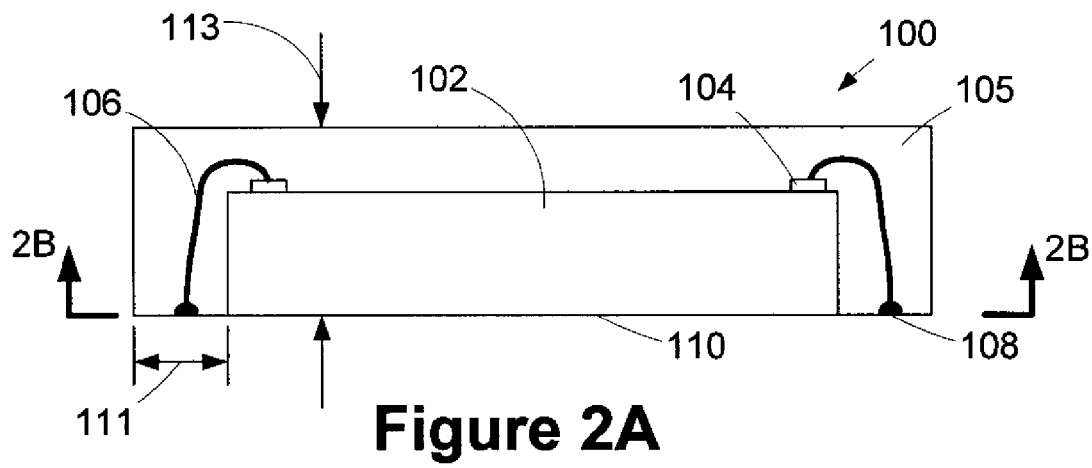
FIGS. 2A-2C are various views of a packaged integrated circuit device in accordance with various aspects of the present invention.
Figure 2B:
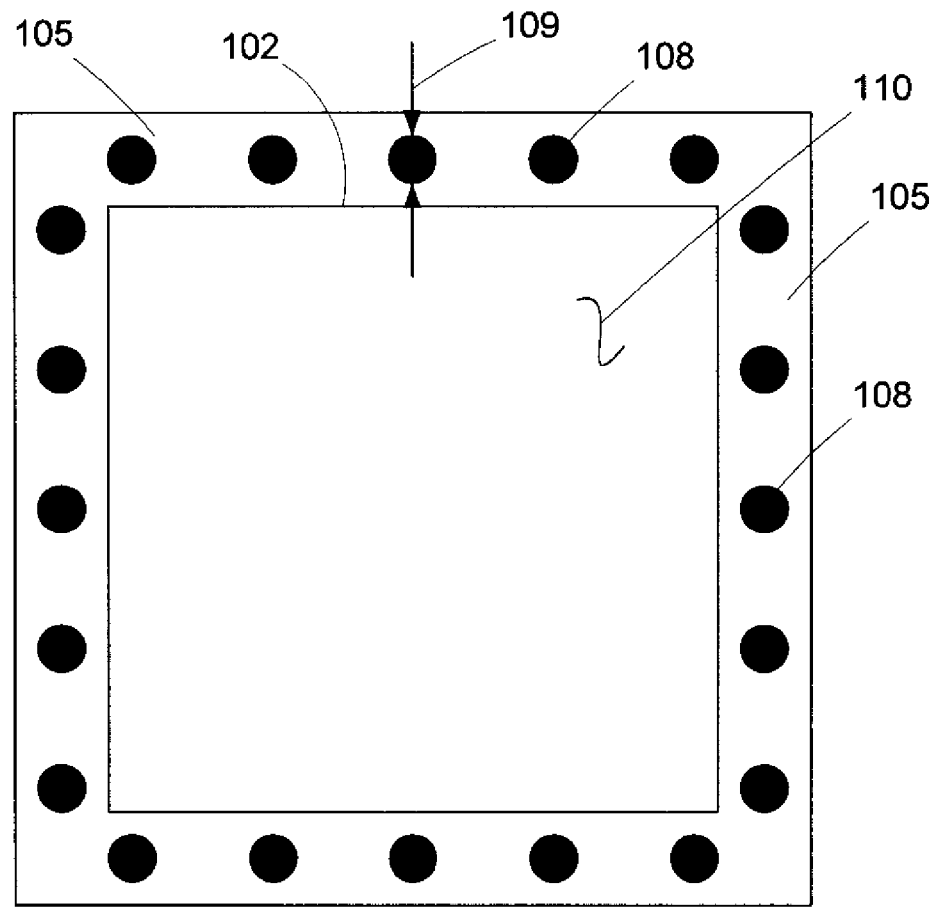
Figure 2C:
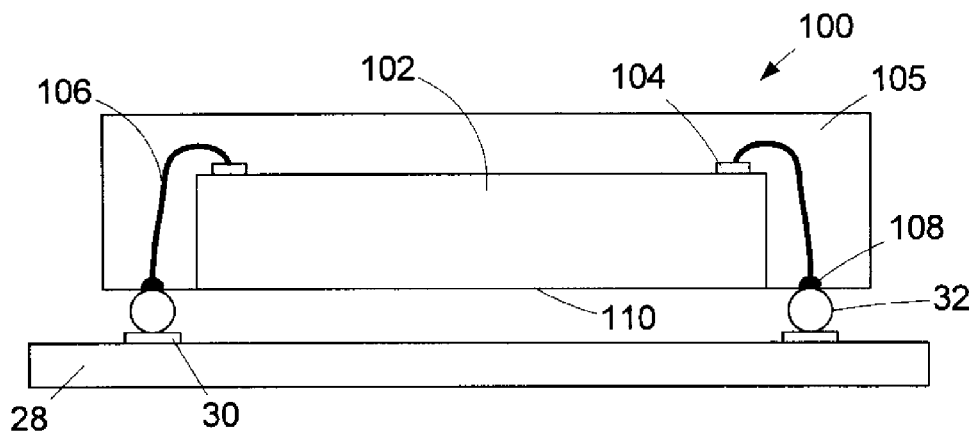

FIGS. 2A-2C depict one illustrative embodiment of a packaged integrated circuit (IC) device 100 in accordance with one aspect of the present invention. As shown in FIG. 2A, the device 100 comprises an integrated circuit chip (IC chip) 102, a plurality of bond pads 104, a plurality of wire bonds 106, each of which are conductively coupled to an exposed conductive portion 108. Also depicted in FIG. 2A is the exposed backside 110 of the IC chip 102. An encapsulant material 105, e.g., an epoxy or molding material, encapsulates the IC chip 102 except for the exposed backside surface 110. FIG. 2B is a bottom view of the device 100. As shown therein, the conductive portions 108 are positioned in the encapsulant material 105 around the perimeter of the IC chip 102. In the illustrative embodiment depicted in FIGS. 2A-2C, the exposed conductive portions 108 are on substantially the same plane as the exposed backside 110 of the IC chip 102. Moreover, in one illustrative embodiment, the exposed conductive portions 108 may have a generally circular cross-sectional configuration and a diameter 109 of approximately 16-80 µm.

FIG. 2C is one illustrative example that depicts how the device 100 may be conductively coupled to a conductive structure 28. The conductive structure 28 may be any type of structure to which it is desired to operatively couple an integrated circuit device, e.g., a printed circuit board, a silicon interposer, a motherboard, flex tape, a memory module, etc. As shown therein, the device 100 may be operatively coupled to the conductive structure 28 by a plurality of solder balls 32 that are conductively coupled to the exposed conductive portions 108 and the bond pads 30 on the conductive structure 28. As will be recognized by those skilled in the art after a complete reading of the present application, the device 100 may be conductively coupled to the conductive structure 28 by a variety of known techniques.

As will be recognized by those skilled in the art after a complete reading of the present application, the packaged device 100 may be employed with any type of IC chip 102, e.g., memory chips, microprocessors, ASICs, etc. Additionally, the precise shape, location and material of the illustrative bond pads 104 and wire bonds 106 may vary depending upon the particular application. Thus, the illustrative embodiment depicted herein should not be considered a limitation of the present invention.

Figure 3A:
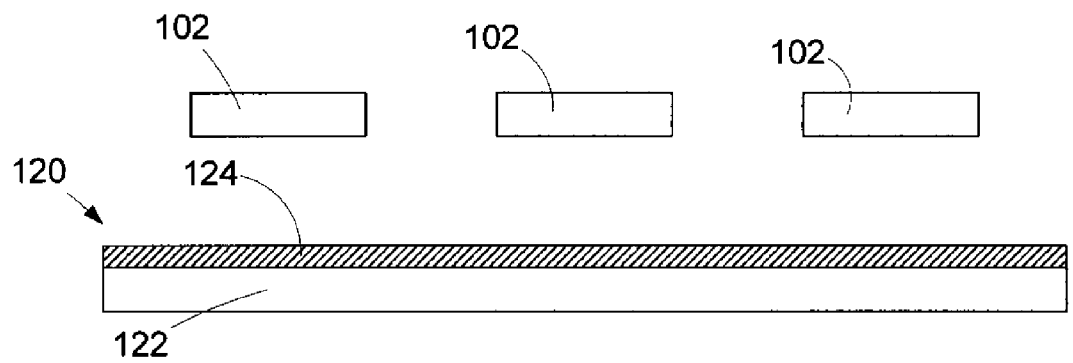
FIGS. 3A-3E are various views of one illustrative method of forming the device shown in FIGS. 2A-2C.
Figure 3B:
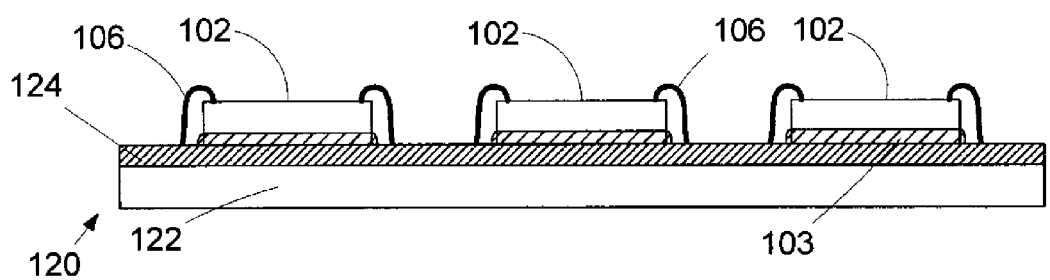

FIGS. 3A-3E depict one illustrative method of forming the packaged IC device 100. FIG. 3A depicts a plurality of singulated IC chips 102 that are ready to be packaged. The IC chips 102 have been manufactured and singulated using any of a variety of known processing techniques. Initially, as indicated in FIG. 3B, the IC chips 102 will be attached to a sacrificial structure 120 using, for example, an adhesive material 103 or adhesive tape. The sacrificial structure 120 comprises at least some conductive material to which the wire bonds 106 will be attached, as described more fully below. In the illustrative embodiment depicted in FIG. 3A, the sacrificial structure 120 comprises a substrate 122 and a layer of conductive material 124, e.g., a metal such as aluminum. In one embodiment, the substrate 122 is comprised of a ceramic material and it may have a thickness of approximately 0.135-0.5 mm. The substrate 122 may also be comprised of other materials, such as an organic laminate, polymer, polyester, silicon, etc. The layer of conductive material 124 may be deposited by a variety of known processes, e.g., sputter deposition, and it may have a thickness of approximately 0.1-30 µm. In the illustrative embodiment depicted in FIG. 3A, the conductive portion of the sacrificial structure 120 takes the illustrative form of the conductive layer 124. However, other forms are also possible. For example, as shown in FIG. 4, the conductive portion of the sacrificial structure 120 may take the form of a plurality of spaced-apart conductive structures 124A that correspond in location to the conductive end portions 108 of the device 100. The spaced-apart conductive region 124A may be of any desired shape, i.e., rectangular, rounded, etc. Other structures are also possible.

Next, as indicated in FIG. 3B, the wire bonds 106 are attached to the IC chips 102 and the conductive portion of the sacrificial structure 120, e.g., the illustrative conductive layer 124. The wire bonds 106 may be comprised of a variety of materials, e.g., gold, aluminum, copper, etc., and they may be attached to the IC chip 102 and the conductive layer 124 using a variety of known techniques. Attaching the wire bonds 106 to the conductive portion of the sacrificial structure 120 results in the formation of the conductive end portions 108. Thus, depending on the particular materials of construction of the wire bond 106 and the conductive portion of the sacrificial structure 120, e.g., the conductive layer 124, the conductive end portions 108 may comprise a combination of such materials.

Figure 3C:
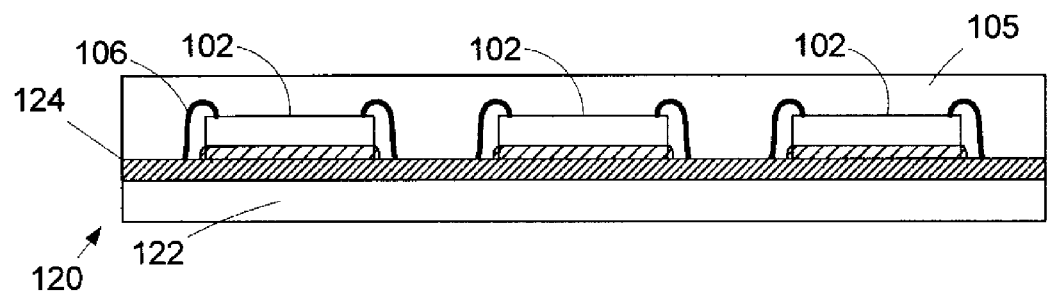
Figure 4:
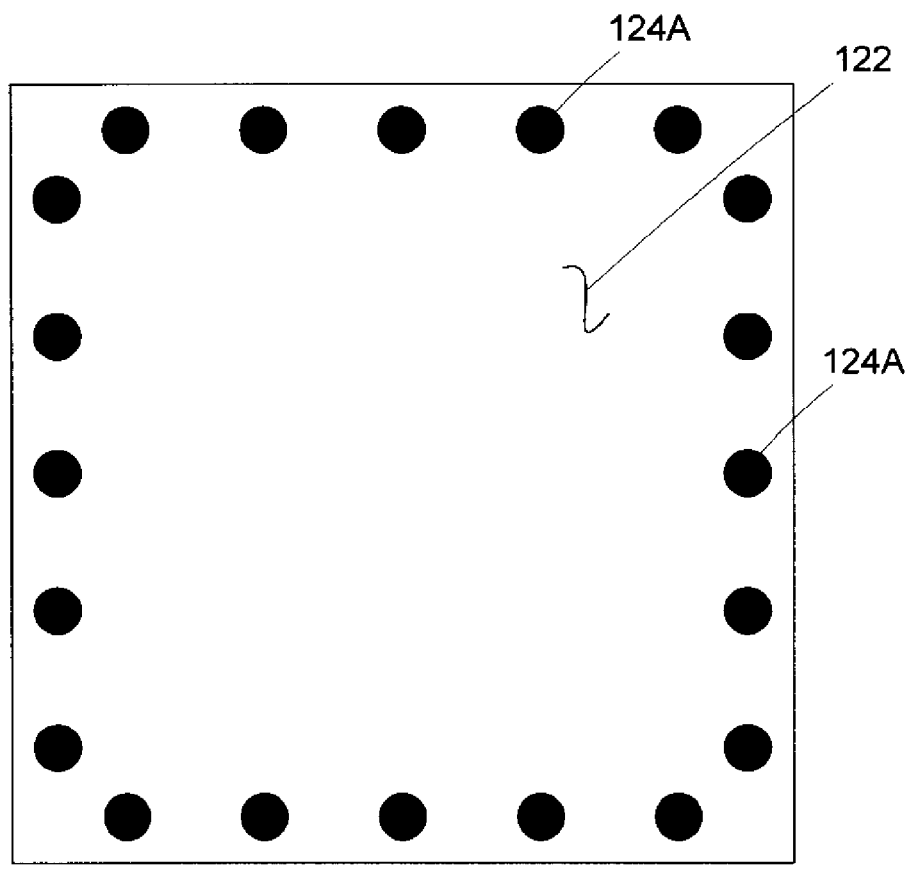
FIG. 4 depicts an alternative embodiment of the conductive portion of the sacrificial structure.

Then, as shown in FIG. 3C, an encapsulant 105, e.g., an epoxy material or molding compound, is formed around the IC chips 102. The encapsulant 105 may be comprised of a variety of known materials, such as epoxy, liquid encapsulant, epoxy mold compound, a powder, etc., and it may be applied or formed around the IC chips 102 using a variety of known techniques.

Figure 3D:
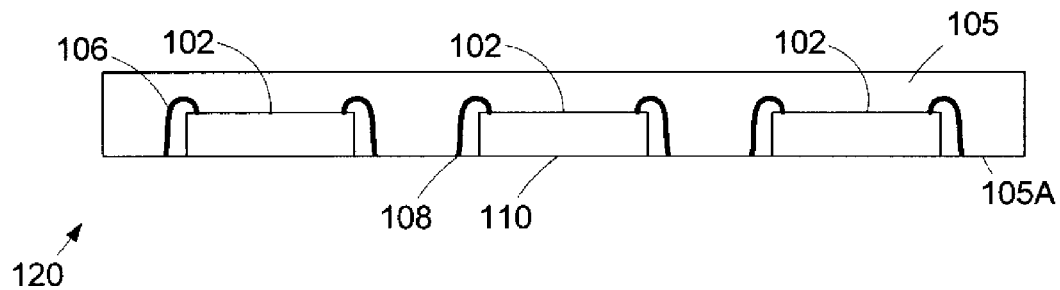
Figure 3E:
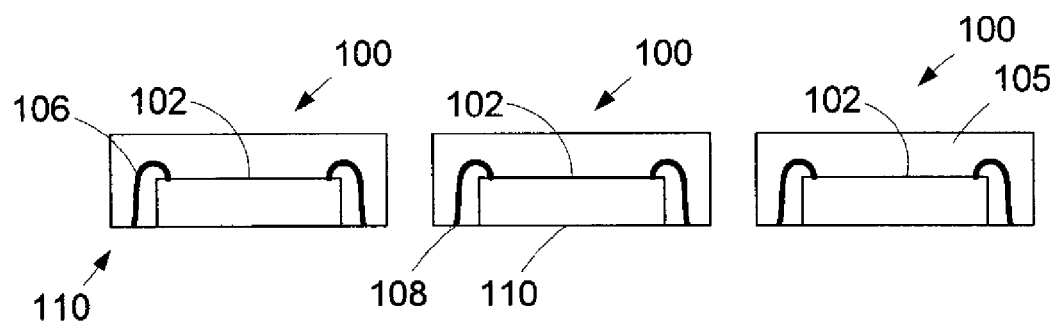

As shown in FIG. 3D, one or more process operations are then performed to remove the sacrificial structure 120 thereby exposing the backside 110 of the IC chips 102 and the exposed conductive portions 108. The sacrificial structure 120 may be removed by a variety of techniques. In one illustrative embodiment, the sacrificial structure 120 may be removed by performing a planarization process. For example, the sacrificial structure 120 may be removed by performing one or more chemical mechanical polishing processes, by performing a grinding process, or by performing an etching process, or a combination of such processes. The end result of these operations is a substantially planar surface 105A which exposes the backside 110 of the IC chips 102 and the exposed conductive portions 108. FIG. 3E depicts three individual packaged devices 100 after they have been singulated and after the encapsulant material 105 has been trimmed.

Through use of the present invention, the physical space occupied by the packaged device IC 100 may be reduced as compared to prior art packaged IC devices. Since the present invention does not involve the formation of the relatively large conductive bond pads 22 on a carrier 14, as shown in FIG. 1A, the length and width of the overall packaged IC device 100 may be reduced. For example, as shown in FIG. 2A, the horizontal dimension 111 from the edge of the IC chip 102 to the edge of the encapsulant material 105 may be approximately 0.1-0.4 mm. In contrast, the corresponding dimension 11 for the device 10 shown in FIG. 1A may be approximately 0.5-1.0 mm. Thus, through use of the present invention, the "footprint" of the packaged IC device 100 may be reduced. Additionally, since the illustrative packaged IC device 100 disclosed herein does not comprise a carrier structure, like the carrier 14 depicted in FIG. 1A, it occupies less vertical space, i.e., it is shorter, as compared to prior art packaged IC devices. For example, in one illustrative embodiment, the overall height 113 (see FIG. 2A) of the packaged IC device 100 may range from approximately 0.1-0.5 mm.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   an integrated circuit chip including a backside surface defining a backside plane;
   a plurality of wire bonds conductively coupled to the integrated circuit chip, the wire bonds individually having a first end connected to the integrated circuit chip and a second end at the backside plane, the second end defining a conductive exposed portion that is an integrally formed part of the wire bond, wherein the first end is opposite the second end;
an encapsulant material encasing at least portions of (a) the integrated circuit chip and (b) the wire bonds, wherein the backside surface of the integrated circuit chip at the backside plane and the second ends of the wire bonds at the backside plane are exposed through the encapsulant material, and the encapsulant material has a mechanically altered bottom surface at the backside plane extending between the second ends of the wire bonds and the backside surface of the integrated circuit chip;
a conductive structure including a plurality of bond pads spaced from the second ends of the wire bonds; and
a plurality of conductive balls conductively coupling the wire bonds to the conductive structure, the conductive balls individually including a first side directly attached to a second end of a wire bond at the backside plane and a second side directly attached to a corresponding bond pad of the conductive structure.

2. The device of claim 1, wherein the integrated circuit chip comprises at least one of a memory device, a microprocessor and an application specific integrated circuit device.

3. The device of claim 1, wherein the wire bonds are comprised of gold.

4. The device of claim 1, wherein the wire bonds are comprised of aluminum.

5. The device of claim 1, wherein the wire bonds are comprised of copper.

6. The device of claim 1, wherein the second ends of the wire bonds are spaced from the bond pads of the conductive structure by the conductive balls.

7. The device of claim 1, wherein the backside surface is a surface that has been subjected to at least one processing operation after the encapsulant material is formed.

8. The device of claim 1, wherein the conductive structure comprises a printed circuit board, a silicon interposer, a motherboard, flex tape, or a memory module.

9. A device, comprising:
an integrated circuit chip including an exposed backside surface defining a plane;
a plurality of wire bonds, the individual wire bonds being operably coupled to the integrated circuit chip via a conductive coupling, the individual wire bonds terminating at a distal end with a mechanically altered conductive exposed portion that is positioned in the plane defined by the backside surface, wherein the conductive exposed portions are integrally formed parts of the wire bonds;
an encapsulant material encasing the integrated circuit chip except the backside surface and encasing the plurality of wire bonds except the conductive exposed portions; and
a plurality of conductive balls directly conductively coupling the conductive exposed portions to a conductive structure.

10. The device of claim 9, wherein the integrated circuit chip comprises at least one of a memory device, a microprocessor and an application specific integrated circuit device.

11. The device of claim 9, wherein the wire bonds are comprised of at least one of gold, aluminum and copper.

12. The device of claim 9, wherein the exposed conductive portions are comprised of aluminum.

13. The device of claim 9, wherein the conductive structure comprises a printed circuit board, a silicon interposer, a motherboard, flex tape, or a memory module.

14. The device of claim 9, wherein the encapsulant material comprises a bottom surface that is positioned substantially in the plane.

15. The device of claim 9, wherein a distance from a side of the integrated circuit chip to a side of the encapsulant material ranges from approximately 0.1-0.4 mm and wherein a distance from the backside surface to a top surface of the encapsulant material ranges from approximately 0.1-0.5 mm.

16. The device of claim 1, wherein the second ends of the wire bonds are generally circular.

17. A device, comprising:
an integrated circuit chip having a perimeter;
a plurality of wire bonds conductively coupled to the integrated circuit chip, the wire bonds individually having a first end connected to the integrated circuit chip and a second end opposite the first end, the second end being integrally formed part of the wire bond;
an encapsulant material encasing at least portions of (a) the integrated circuit chip and (b) the wire bonds, the encapsulant material having a mechanically altered bottom surface defining a plane around the perimeter of the integrated circuit chip, the second ends of the wire bonds being exposed through the encapsulant material at the plane; and
a conductive structure including a plurality of bond pads spaced from the second ends of the wire bonds, wherein the bond pads of the conductive structure are conductively coupled to the second ends of the wire bonds without intervening bond pads between the second ends of the wire bonds and the bond pads of the conductive structure.

18. The device of claim 17, further comprising a plurality of conductive balls conductively coupling the wire bonds to the conductive structure, the conductive balls individually including a first side directly attached to a second end of a wire bond, and a second side directly attached to a corresponding bond pad of the conductive structure.

19. The device of claim 17, wherein the second ends of the wire bonds are generally circular.

20. The device of claim 1, wherein the mechanically altered bottom surface is a planarized surface.

21. The device of claim 1, wherein the mechanically altered bottom surface is a ground surface.

22. The device of claim 9, wherein the mechanically altered conductive exposed portion is a planarized conductive exposed portion.

23. The device of claim 9, wherein the mechanically altered conductive exposed portion is a ground conductive exposed portion.

24. The device of claim 17, wherein the mechanically altered bottom surface is a planarized surface.

25. The device of claim 17, wherein the mechanically altered bottom surface is a ground surface.

* * * * *